United States Patent [19]

Hereth et al.

[11] Patent Number: 4,710,903

[45] Date of Patent: Dec. 1, 1987

[54] PSEUDO-STATIC MEMORY SUBSYSTEM

[75] Inventors: Michael R. Hereth; Patricia A. Martin, both of Westford, Mass.

[73] Assignee: Wang Laboratories, Inc., Lowell, Mass.

[21] Appl. No.: 846,328

[22] Filed: Mar. 31, 1986

[51] Int. Cl.⁴ ............................................. G11C 11/40
[52] U.S. Cl. ..................................... 365/194; 365/195; 365/222; 365/226; 365/227
[58] Field of Search ................ 365/182, 189, 194, 195, 365/222, 226, 230, 227

[56] References Cited

U.S. PATENT DOCUMENTS 4,556,961 12/1985 Iwahashi et al. ..................... 365/194

Primary Examiner—Terrell W. Fears
Attorney, Agent, or Firm—Michael H. Shanahan

[57] ABSTRACT

A memory subsystem comprises pseudo-static memory chips operable in a low power self refresh mode or in a standby mode in which less access time is required. All memory chips are initially placed in the self refresh mode and are changed to the standby mode only when individually accessed. Then, the accessed chip is retained in the standby mode until such time as all chips are periodically returned to the self refresh mode. When a memory chip is first changed to the standby mode a delay time is provided to allow for the greater required access time. Thereafter, the memory chips which have then been placed in the standby mode are tracked by latching of addresses and comparison of the latched addresses to subsequently received addresses.

26 Claims, 4 Drawing Figures

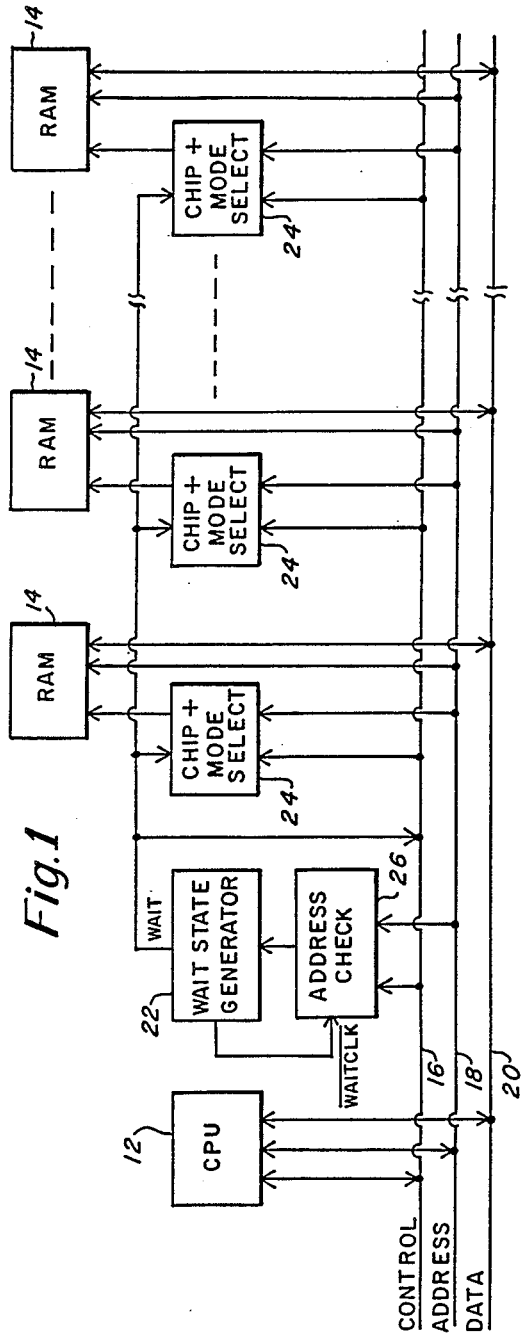

PSEUDO-STATIC MEMORY SUBSYSTEM

DESCRIPTION

BACKGROUND

The two primary types of random access memories used in data processing systems are the dynamic RAM and the static RAM. The dynamic RAM is often the memory of choice because each memory cell includes fewer circuit elements and a larger density memory can thus be obtained. Also, dynamic memories typically have shorter access times. A disadvantage of such memory devices is that the charge stored on each memory cell must be replenished periodically such as every four milliseconds. However, even with the addition of refresh circuitry, the dynamic RAMs have greater density.

With the introduction of portable computers which operate on battery supplies, the power requirements of memories become a greater factor in system design. Static memories draw less current from the battery and may thus be chosen despite their lesser density and greater access times.

Recently, a new dynamic RAM referred to as a pseudo-static RAM has been developed. The pseudo-static RAM may be placed in a self refresh "sleep" mode in which the dynamic memory is refreshed by refresh signals generated by logic circuitry on the memory chip itself with current requirements of only about 100 microamps. The memory is intended to be accessed while it is in a standby mode which requires up to one milliamp of current. Once accessed, the memory uses 40 to 50 milliamps. In the standby mode, the memory performs as a dynamic RAM and must therefore be periodically refreshed. If the memory chip is accessed while it is in the self refresh mode it must be given sufficient time to change to the standby mode before information can be written into or read from the memory chip.

SUMMARY OF INVENTION

The present invention has particular application to data processing systems having very stringent power requirements and which use pseudo-static RAMs. In accordance with the invention the low power self refresh mode of the pseudo-static RAM may be used to great advantage in minimizing power requirements without unduly degrading the average access time of the memory. To that end, a memory subsystem comprises memory devices which may be placed in a standby mode or in a low power mode in which greater access time is required. The subsystem includes means for placing the memory devices in the low power mode and means for selectively accessing discrete blocks of memory which are either in the standby mode or in the low power mode. Access to a block of memory which is in the low power mode is delayed, however, to allow for the greater access time in that mode. Means is also provided for retaining an accessed block of memory in the standby mode and for preventing delay of subsequent access to such a block of memory.

When in the standby mode of operation the memory must be periodically refreshed. To that end, the blocks of memory in the standby mode may be periodically returned to the self refresh mode. Thus, once removed from the low power mode, a chip remains in a standby mode until all enabled chips are periodically returned to the low power, self refresh mode.

Delay of access to a block of memory in the standby mode may be prevented by storing the address of a previously accessed block of memory. Delay is precluded when a block of memory having the stored address is subsequently accessed. In many systems, an optimal number of blocks of memory for which delay is prevented is three in order to allow for a microinstruction from one block of memory to be used to move data from another block of memory to a third block of memory. In tracking addresses of blocks of memory in the standby mode, an address check circuit may be sequenced through plural address check periods. In the first period an access delay is always provided and the address being accessed is latched into a first latch. In subsequent periods, access delay is only provided if there is no match between the address being accessed and an address which is stored. In a final period of the sequence, a maximum number of addresses are stored; and if there is no match with an incoming address, the address check circuit is reset and returned to the first period of the sequence.

The inputs to a memory chip which select the mode of chip operation can be generated in logic circuitry responsive to the chip address, a wait signal and read and write signals. When a particular chip is addressed, regardless of whether that chip is in the self refresh mode or in the standby mode, a chip enable signal is generated. The chip enable signal sets a self refresh flip-flop which removes the self refresh signal and causes the chip to change from the self refresh mode to the standby mode if it was previously in the self refresh mode. The chip enable signal also generates a chip select signal which is applied to the chip, but that signal is only generated when a wait signal is not received from a wait generator circuit to indicate that further access time is required. The chip select signal is logically combined with a memory read signal and with the output from the self refresh flop to generate the memory chip output enable signal. A pulse refresh train input may also be gated with the self refresh signal in generating the output enable signal.

BRIEF DESCRIPTION OF THE DRAWINGS

The foregoing and other objects, features and advantages of the invention will be apparent from the following more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 1 is a block diagram of a data processing system embodying the present invention;

FIG. 2 is a truth table for the pseudo-static memory devices used in the system of FIG. 1;

DESCRIPTION OF A PREFERRED EMBODIMENT

Figure 3:
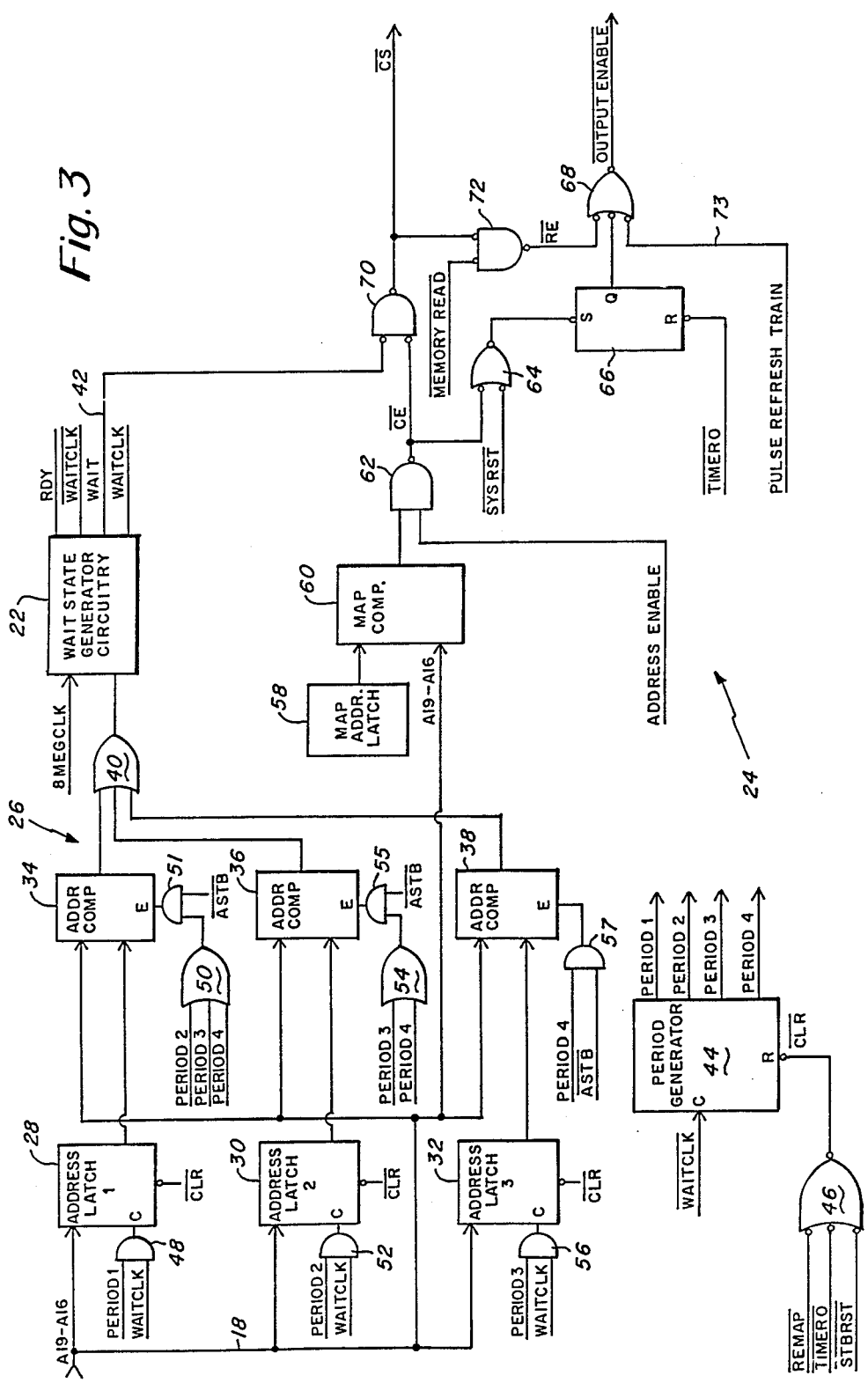
FIG. 3 is a detailed block diagram of the address check cicuitry and the chip and mode select circuitry in FIG. 1.

The portion of a portable computer system for which the present invention was developed is illustrated in FIG. 1. Shown are a central processing unit 12 and a set of pseudo-static RAM chips 14 connected to control, address and data buses 16, 18 and 20. It will be recognized that peripheral devices and other memory units may also be connected to the bus lines, but the present invention is directed to the control of the pseudo-static RAMs.

A truth table for a typical pseudo-static RAM such as that sold by NEC Corporation, Model 42832 is illustrated in FIG. 2. When a memory chip is accessed, its chip select input CS is pulled low. If the write enable WE and the output enable OE inputs are left high, an external refresh may be applied to an internal address indicated by the address input to the chip. By pulling the write enable input or the output enable input low with the chip select signal low, data may be either written into or read from the internal address applied to the address inputs. When a specific location in memory is not being accessed, the chip select input is returned high. If the output enable input is also held high, the chip is retained in a standby mode in which it may be quickly accessed in a read, write or external refresh operation. However, in the standby mode there is a current drain of up to one milliamp.

A unique feature of the pseudo-static RAM is that it may be placed in a low power, self refresh mode by pulling the output enable low with the chip select left high. In this mode of operation the memory cells are periodically refreshed by refresh circuitry on the chip itself and the CPU need not provide the external refresh control and address signals. In this mode of operation, the stored data is retained with a current drain of only about 100 microamps. A disadvantage of placing the chip in the self refresh mode is that it takes time to remove it from the self refresh mode before the memory can be accessed for reading or writing. Thus, the memory chips are typically held in the standby mode during times in which they might be accessed and then returned to the self refresh mode when access is unlikely.

Prior to returning the particular NEC chip used in the present system to self refresh mode, a pulse refresh train of eight pulses is applied to the output enable pin. In accordance with the present invention, all memory chips 14 are initially placed in the self refresh mode for low power dissipation. Thereafter, any chip may be accessed by the CPU. When it is first accessed, however, a wait signal is generated by a wait state generator 22. The wait signal holds the CPU idle while the addressed RAM is changed to the standby mode through a chip and mode select circuit 24. Once sufficient time has been allowed for the RAM to be placed in the standby mode, a specific memory location within the chip may be accessed by the CPU. Thereafter, the accessed chip is retained in the standby mode so that further delays may be avoided when that chip is again accessed. If, however, the memory location in another chip 14 is accessed, a wait signal is again generated by the wait state generator 22 to again hold the CPU idle while the additional chip is moved from the self refresh mode to the standby mode through an associated chip and mode select circuit 24.

The memory chips 14 cannot be held in the standby mode indefinitely without either providing an external refresh or returning the memory chip to the self refresh mode. Rather than requiring the CPU to identify those chips which require refreshing, the present system returns all pseudo-static chips to the self refresh mode every 100 microseconds. Then, selected memory chips are again returned to the standby mode as memory locations within those chips are accessed.

To determine when an access delay is required to move a memory chip from the self refresh mode of operation, access to the chips is monitored by an address check circuit 26. Within hardware limitations of the system described below, once a chip has been placed in the standby mode within a 100 microsecond cycle, further delay in accessing that chip is avoided.

Details of the address check cicuit 26 and the chip and mode select circuits 24 are illustrated in FIG. 3. As a memory location in a chip is accessed, the most significant bits of its address which identify a block of memory are latched into one of the address latches 28, 30 and 32 for comparison with subsequent addresses in comparators 34, 36 and 38. Whenever a positive comparison is made between an incoming address and an address stored in one of the latches 28, 30 and 32, a signal is applied through an OR gate 40 to the wait state generator 22. That no further wait is required is indicated by a low signal on the WAIT output of the generator 22.

The present system treats pairs of chips as blocks of memory; thus, when one chip is moved to standby mode, the other chip of that block is also changed to standby mode. The system allows for storage of up to $N=3$ addresses of previously accessed memory blocks and thus considers up to three memory blocks to be in the standby state. Additional latches may be provided so that the system can recognize more than three active memory chips in the standby mode. However, three latches is considered to be the best trade-off between system performance and the expense and power requirements of additional system hardware. Microinstructions typically sequence through large blocks of instructions in a single block of memory, and a single latch will retain the address of a single block of memory in which such sequences are stored. On the other hand, a maximum of three chips may be addressed to carry out a particular instruction. Such an instruction might be stored in one memory chip and call for transfer of data from a second chip to a third chip.

There are four possible conditions in the address check operation indicated by a sequence of $N+1$ signals, period one through period four, output from a four bit counter 44. One and only one of the period one through period four signals is held high at any time. The memory check circuit may be cleared by a strobe reset from the CPU, an address remap signal from the CPU or the 100 microsecond timer signal from the CPU through the gate 46. When cleared, period one is high and the others are low. During period one the latches 28, 30 and 32 are cleared so no positive comparison can be made, and gate 40 causes the wait state generator 22 to generate a WAIT signal 42. A WAITCLK signal generated by the wait state generator 22 clocks the latch 28 through an AND gate 48 to store the most significant address bits in the latch 28. Soon after the latching of the address into latch 28, a $\overline{\text{WAITCLK}}$ signal applied from the wait state generator 22 to the period generator 44 sets the period two output high. Finally, the WAIT signal is disabled once sufficient delay has been provided.

In subsequent read or write cycles when the system is in period two, three or four the comparator 34 is enabled through gates 50 and 51 when an address strobe $\overline{\text{ASTB}}$ is received. If the address bits stored in latch 28 then correspond to those on the address bus, an output from comparator 34 through gate 40 prevents a WAIT signal from being generated. So long as the CPU continues to access the same block of memory, the same most significant bits are applied from the address bus 18 to the comparator 34, the system remains in period two, and wait states are precluded. When, however, the most significant bits of the incoming address do not match those stored in the latch 28, the output from the comparator remains low and a wait state is generated by the generator 22. The resultant WAITCLK signal clocks the latch 30 through AND gate 52 so that the address of the chip then being changed to the standby mode is stored in that latch. Also, a $\overline{\text{WAITCLK}}$ signal clocks the period generator 44 to move the system into period three.

In period three both comparators 34 and 36 are enabled through gates 50, 51, 54, and 55; so a wait delay is avoided so long as only the memory indicated by the addresses stored in latches 28 and 30 are accessed. If, during period three, a positive comparison is not made when the comparators 34 and 36 are enabled by the address strobe, a wait signal is generated to allow a third block of memory to be changed to the standby mode, the latch 32 is clocked through gate 56 and the period generator is clocked to period 4. During period 4, all comparators 34, 36 and 38 are enable when an address strobe is received.

The address check circuit is returned to period one after addresses are stored in all three latches and a positive comparison is not made with an incoming address. When no positive comparison is made in period four, a wait signal is generated and the period generator returns its output to period one. In the next memory access, a wait signal is again generated because none of the comparators 34, 36 and 38 is enabled in period one. However, in period one the next address is latched into the latch 28 followed by clocking of the period generator to period two. The system then continues to store up to three addresses which are considered to be in the standby mode until all active chips are returned to the self refresh mode by the 100 microsecond timer.

The present design of the address check circuitry has been adopted for simplicity of the circuit, both to minimize the hardware requirements and to minimize the power requirements of the additional hardware. Thus, in this system no attempt has been made to store more than one, two or three addresses, depending on the period of the address circuitry. Additional memory chips may in fact be in the standby mode from previous accesses, and the address check circuit may thus require an unnecessary wait delay. However, the small loss in performance due to those occasional unnecessary wait delays is offset by the desirable reduction in circuit complexity and power consumption.

A chip and mode select circuit is also illustrated in FIG. 3. An identical chip and mode select circuit is provided for each block of memory. The system allows for remapping of the memory addresses, so the address of a memory chip is stored in a latch 58. The most significant bits on the address bus 18 are compared to the stored address in a map comparator 60 to determine whether the associated memory chip is being addressed. When the address enable signal is received from the CPU, the chip enable output of the NAND gate 62 is pulled low only for that chip for which a positive address comparison is made. The system reset input to gate 64 is normally high, so the low chip enable signal sets a self refresh flip-flop 66 for the chip. A resultant high output from the self refresh flop sets the output of the gate 68 high, a requirement for the standby mode as indicated in the truth table of FIG. 2.

If the self refresh flop 66 had previously been set by previous access to the chip, the output enable signal from gate 68 would have already been high. Further, the active status of the addressed chip would likely have been indicated by a high signal from gate 40 of the address check circuit and the WAIT signal 42 would remain low. As a result, the low chip enable signal $\overline{\text{CE}}$ would be immediately passed through the gate 70 to pull the chip select signal $\overline{\text{CS}}$ low, a condition for either reading from or writing into the memory chip. The chip select signal is also gated with a memory read signal from the CPU in gate 72. If no memory read signal is received, the output of the gate 72 is high and the output enable signal remains high for a write operation. A low write enable control signal (not shown) is also provided by the CPU. On the other hand, if the CPU applies a low memory read signal to the gate 72, the output of that gate is pulled low to pull the output enable signal low for a read operation. Again, the write enable signal is provided directly by the CPU.

Where a memory chip has not previously been accessed, a high output is not provided by the gate 40 of the address check circuit and a WAIT signal 42 is generated by the wait state generator 22. So long as that WAIT signal is held high, the chip select output of gate 70 is held high, thus preventing access to the memory chip for a read or write operation. The chip is caused to change from the self refresh to the standby mode by setting of the flip-flop 66 through the gate 64 to cause the output enable signal from gate 68 to go high.

It can be seen, then, that when the memory chip being accessed is already in the standby mode, the WAIT signal 42 is low so that a low chip select signal is immediately obtained and the write enable and output enable signals immediately respond to the write enable and memory read signals from the CPU. However, if the chip is in the self refresh mode, a WAIT signal is generated to delay the low chip select signal, yet the output enable is promptly put high with setting of the self refresh flip-flop 66. After the delay, the chip select and output enable respond as before.

When all chips are to be returned to the self refresh mode on the 100 microsecond clock, eight pulses are applied on line 73 for a pulse refresh of all active chips. If a chip were still in the self refresh mode the Q output of the self refresh flop 66 would still be maintained low, so the output enable would be continuously low and the pulse refresh train would not be applied to that chip. The pulse refresh train would be applied through the gate 68 to any chips for which the self refresh flop 66 had been set. After the eight pulse refresh train is provided to the chip, a TIMER0 pulse, which is provided every 100 microseconds, resets the self refresh flip-flop 66 for every memory chip.

During system reset, all chips are taken out of the self refresh mode, a pulse refresh is applied, and all chips are returned to the self refresh mode. For that purpose a system reset signal can be applied through the gate 64 to set the self refresh flip-flop 66 for each memory chip. The system reset is followed by a pulse train on line 72 and by a TIMER0 signal to reset all flops 66.

Figure 4:
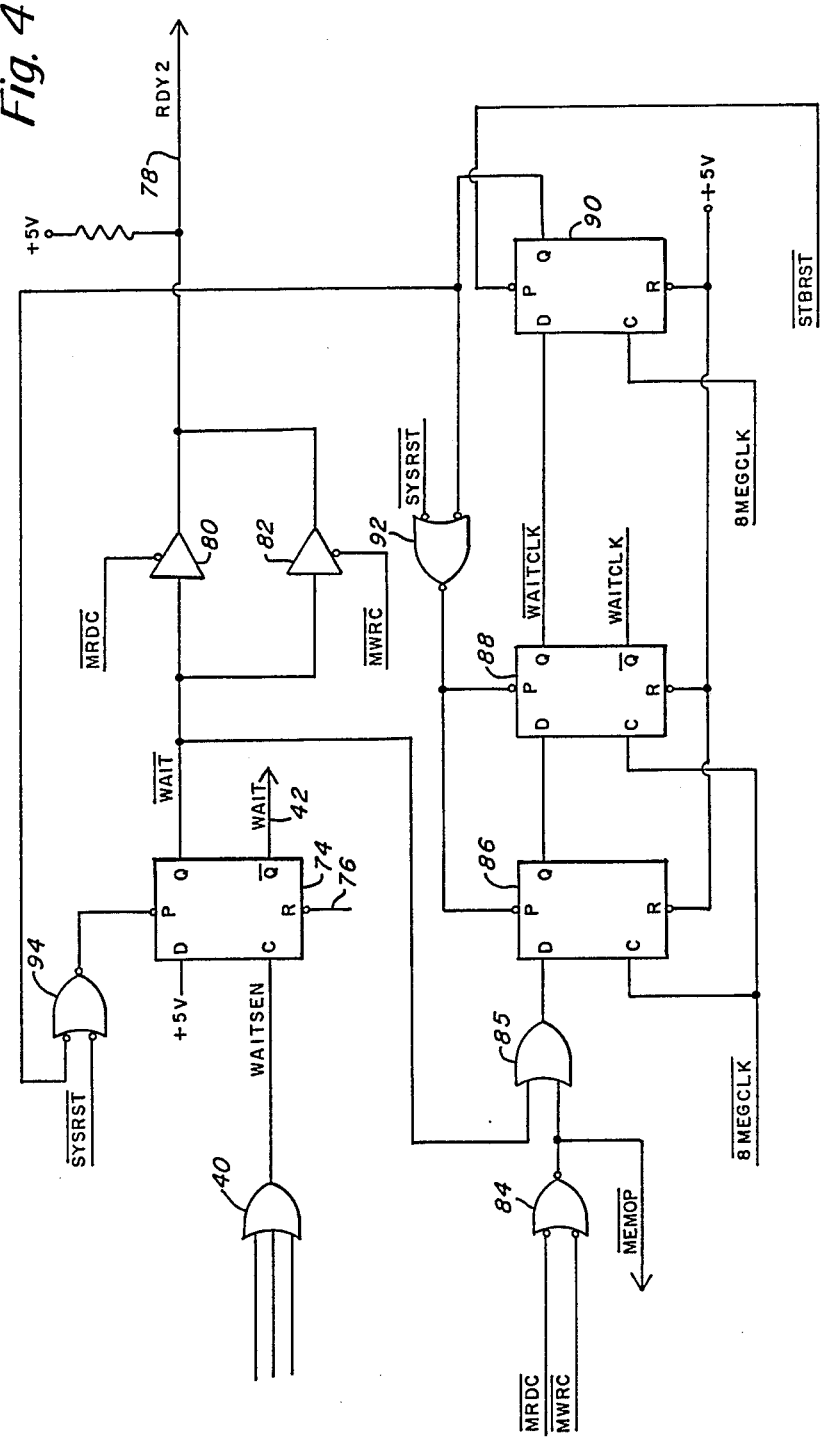
FIG. 4 is a detailed electrical schematic of the wait generator of FIG. 1.

The wait state generator circuitry is illustrated in FIG. 4. When any part of the pseudo-static memory is to be accessed, a wait flip-flop 74 is reset by a memory access signal from the CPU on line 76. The WAIT signal is thus pulled low. If that signal is allowed to remain low it is gated to a ready line 78 through one of the tristate devices 80 or 82. Device 80 is gated by a memory read cycle signal, and device 82 is gated by a memory write cycle signal. If a low WAIT signal is gated to the ready line 78, the CPU is held idle until the ready signal again goes high. However, if the incoming address positively compares to any of the addresses latched in address latches 28, 30 and 32, a pulse is provided through gate 40 to clock the wait flip-flop 74 and cause the $\overline{\text{WAIT}}$ signal to go high. The flop 74 is clocked before either the memory read cycle or the memory write cycle signal is received. Thus, if the latches 28, 30 and 32 indicate that the addressed chip is already in the standby mode, the low $\overline{\text{WAIT}}$ signal is not applied to the ready line 78.

Similarly, the memory read cycle and memory write cycle signals are gated through gate 84 to gate the WAIT signal through gate 85 to a set of delay wait flip-flops 86, 88 and 90. When clocked by an eight megahertz clock these delay flops generate a two and a half cycle delay to enable changing of a memory from the self refresh mode to the standby mode. During that delay, the appropriate latch 28, 30 or 32 is clocked by the rise of the WAITCLK signal from flop 88, depending on the period set by the period generator 44. Then, after another half cycle when the $\overline{\text{WAITCLK}}$ signal goes high, the period generator is clocked to set the address check circuit in the next period. When the low pulses have clocked through the flop 90, the delay flops 86 and 88 are set through gate 92 and the wait flop 74 is set through gate 94. At that time the wait output from the flop 74 returns high to provide a high signal on the ready line 78 and a low WAIT signal to the chip and mode select circuits. At this point, then, a high WAIT signal has been provided on line 42 to delay the chip select signal, the appropriate address latch has been clocked, the period generator has been clocked and the WAIT signal has been finally returned low to permit access to the memory.

While this invention has been particularly shown and described with references to preferred embodiments thereof, it will be understood by those skilled in the art that various changes in form and details may be made therein without departing from the spirit and scope of the invention as defined by the appended claims.

What is claimed is

1. A memory subsystem comprising memory devices which may be placed in a standby mode or in a low power mode in which greater access time is required, the subsystem comprising:
   means for placing the memory devices in the low power mode;
   means for selectively accessing discrete blocks of memory which are in either the standby mode or the low power mode;
   means for delaying access to a block of memory which is in the low power mode; and
   means for retaining an accessed block of memory in the standby mode and for preventing delay of subsequent access to the retained block of memory.

2. A memory subsystem as claimed in claim 1 wherein the memory devices are pseudo-static memory devices and the low power mode is a self refresh mode.

3. A memory subsystem as claimed in claim 1 wherein the means for preventing delay of access to the block of memory comprises a storage device for storing the address of the accessed block of memory.

4. A memory subsystem as claimed in claim 3 comprising plural storage devices for storing the addresses of plural blocks of memory.

5. A memory subsystem as claimed in claim 4 comprising only three storage devices for storing the addresses of accessed blocks of memory.

6. A memory subsystem as claimed in claim 4 comprising means for replacing addresses stored in the storage devices with the addresses of subsequently accessed blocks of memory.

7. A memory subsystem as claimed in claim 6 in which N storage devices store memory addresses through a sequence of N+1 periods such that access is delayed when an address is received during the first period and the received address is stored in the storage device and such that the received addresses are compared with previously stored addresses during all subsequent periods and access is delayed and the sequence is clocked when the received address is not the same as any of the stored addresses and wherein the sequence is returned to the first period one after being clocked from period N+1.

8. A memory subsystem as claimed in claim 7 wherein all blocks of memory in the subsystem are periodically placed in the low power mode.

9. A memory subsystem as claimed in claim 4 wherein all blocks of memory in the subsystem are periodically placed in the low power mode.

10. A memory subsystem as claimed in claim 1 wherein the means for preventing delay of access includes means for tracking plural blocks of memory which have been accessed and which are retained in the standby mode.

11. A memory subsystem as claimed in claim 10 wherein up to only three blocks of memory are tracked simultaneously.

12. A memory subsystem as claimed in claim 10 wherein the means for preventing delay of access to the block of memory comprises a storage device for storing the address of the accessed block of memory.

13. A memory subsystem as claimed in claim 12 wherein all blocks of memory in the subsystem are periodically placed in the low power mode.

14. A memory subsystem as claimed in claim 10 wherein all blocks of memory in the subsystem are periodically placed in the low power mode.

15. A memory subsystem as claimed in claim 1 wherein all blocks of memory in the subsystem are periodically placed in the low power mode.

16. A memory subsystem as claimed in claim 1 wherein the low power mode is a self refresh mode and the means for retaining an accessed block of memory in the standby mode comprises a latch which is latched when an associated block of memory is accessed.

17. A memory subsystem as claimed in claim 16 wherein a latch associated with each block of memory is periodically reset to return the block of memory to the self refresh mode.

18. A memory subsystem as claimed in claim 17 wherein the means for preventing delay of access to the block of memory comprises a storage device for storing the address of the accessed block of memory.

19. A memory subsystem as claimed in claim 16 further comprising means for generating a first enable signal for setting the latch, means for generating a chip select signal as an input to a memory chip in response to the first enable signal only when access to the chip is not being delayed and means for generating an output enable signal applied to the memory chip when the latch is not set or when a memory read signal is received and the access to the chip is not being delayed.

20. A memory subsystem as claimed in claim 19 wherein each latch is periodically reset to return each chip to the self refresh mode.

21. A memory subsystem as claimed in claim 1 wherein the low power mode is a self refresh mode and once each block of memory is in the standby mode it is retained in the standby mode until it is returned to the self refresh mode, the system further comprising means for periodically returning all blocks of memory to the self refresh mode within the time required for refresh.

22. A method of controlling access to memory devices which may be placed in a standby mode or in a low power mode in which greater access time is required, the method comprising:
    placing the memory devices in the low power mode;
    selectively accessing descrete blocks of memory which are in either the standby mode or the low power mode;
    delaying access to a block of memory which is in the low power mode; and
    retaining an accessed block of memory in the standby mode and preventing delay of subsequent access to the retained block of memory.

23. A method as claimed in claim 22 wherein delay of access to the block of memory is prevented by storing the addresses of accessed blocks of memory, comparing the stored addresses with addresses of blocks of memory to be accessed and delaying access to those blocks of memory where a positive comparison is made.

24. A method as claimed in claim 23 wherein further comprising a step of periodically placing all blocks of memory in the system in the low power mode.

25. A method as claimed in claim 22 wherein further comprising a step of periodically placing all blocks of memory in the system in the low power mode.

26. A method as claimed in claim 22 wherein the low power mode is a self refresh mode and further comprising the step of periodically returning all blocks of memory to the self refresh mode within the time required for refresh of the memory.

* * * * *